United States Patent
Nishida

(10) Patent No.: US 6,869,863 B2
(45) Date of Patent: Mar. 22, 2005

(54) FABRICATION PROCESS OF SOLAR CELL

(75) Inventor: Shoji Nishida, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 10/379,457

(22) Filed: Mar. 3, 2003

(65) Prior Publication Data

US 2004/0048411 A1 Mar. 11, 2004

Related U.S. Application Data

(62) Division of application No. 09/927,406, filed on Aug. 13, 2001, now abandoned, which is a division of application No. 08/932,708, filed on Sep. 18, 1997, now Pat. No. 6,387,780.

(30) Foreign Application Priority Data

Sep. 19, 1996 (JP) .............................................. 8-248217

(51) Int. Cl.$^7$ .......................... H01L 21/00; C30B 19/00
(52) U.S. Cl. ...................... 438/497; 438/500; 438/955; 438/57; 117/60; 117/64; 117/934
(58) Field of Search .......................... 438/57, 497, 500, 438/955, FOR 279, FOR 282; 117/60, 64, 934; 136/261

(56) References Cited

U.S. PATENT DOCUMENTS

| | | | | |
|---|---|---|---|---|
| 4,201,623 A | 5/1980 | Sumner | ...................... | 156/622 |
| 4,236,947 A | 12/1980 | Baliga | ...................... | 148/171 |
| 4,778,478 A | 10/1988 | Barnett | ...................... | 437/5 |
| 5,314,571 A | 5/1994 | Ciszek | ...................... | 117/60 |
| 5,360,745 A | 11/1994 | Sasaki et al. | ................... | 437/4 |
| 5,441,577 A | 8/1995 | Sasaki et al. | ................ | 136/244 |
| 5,544,616 A | 8/1996 | Ciszek et al. | ................. | 117/60 |
| 5,575,862 A | 11/1996 | Nishida | ...................... | 136/258 |
| 6,387,780 B1 * | 5/2002 | Nishida | ...................... | 438/497 |

FOREIGN PATENT DOCUMENTS

JP 9-36403 2/1997

OTHER PUBLICATIONS

T.H. Wang, et al., "Growth of Silicon Thin Layers on Cast MG–Si from Metal Solutions for Solar Cells", Solar Energy Mat. and Solar Cells, vol. 41/42, pp. 19–30 (1996).

I. Reis, et al., "Recrystallization of Polycrystalline Silicon Layers by an Optical Heating Technique", 8$^{th}$ E.C. Photovoltaic Solar Energy Conf., Proc. Int'l Conf., Florence, Italy, vol. II, pp. 1280–1284 (1988).

Patent Abstracts of Japan, vol. 012, No. 407 (E–675), Oct. 27, 1988 (corresponds to JP 63–147312).

Patent Abstracts of Japan, vol. 009, No. 169 (E–328), Jul. 13, 1985 (corresponds to JP 60–043813).

T.F. Ciszek, et al., "Si Thin Layer Growth from Metal Solutions on Single–Crystal and Cast Metallurgical–Grade Multicrystalline Si Substrates", 23$^{rd}$ IEEE Photovoltaic Spec. Conf., Louisville, Kentucky, pp. 65–72 (1993).

* cited by examiner

*Primary Examiner*—M. Wilczewski
(74) *Attorney, Agent, or Firm*—Fitzpatrick, Cella, Harper & Scinto

(57) ABSTRACT

Metal-grade silicon is melted and solidified in a mold to form a plate-shaped silicon layer and a crystalline silicon layer is made thereon, thereby providing a cheap solar cell without a need for a slicing step.

7 Claims, 2 Drawing Sheets

MELTING / SOLIDIFICATION

DISSOLUTION / REPRECIPITATION

MELTING / SOLIDIFICATION

DISSOLUTION / REPRECIPITATION

LIQUID PHASE GROWTH

FABRICATION PROCESS OF SOLAR CELL

This application is a division of application Ser. No. 09/927,406, filed Aug. 13, 2001, now abandoned which is a division of application Ser. No. 08/932,708, filed Sep. 18, 1997, now U.S. Pat. No. 6,387,780.

BACKGROUND OF THE INVENTION

1. Field of the Invention

The present invention relates to a fabrication process of solar cell. More specifically, the present invention relates to a process of fabricating a solar cell suitably applicable to a solar cell comprising stacked thin films of polycrystalline silicon on a cheap substrate.

2. Related Background Art

Solar cells are widely studied and some are in practical use, as driving energy sources of various devices or as power supplies connected to the commercial power supply system.

A requirement for the solar cells in respect of cost is that an element can be formed on a cheap substrate like metal. On the other hand, silicon is normally used as a semiconductor for making the solar cells. Among others, single-crystal silicon is most excellent from the viewpoint of efficiency for converting light energy to electromotive force, i.e., from the viewpoint of photoelectric conversion efficiency. It is, however, said that amorphous silicon is more advantageous from the viewpoints of increase in area and decrease in cost. In recent years, use of polycrystalline silicon is under study, for the purpose of achieving low cost comparable to that of amorphous silicon and high energy conversion efficiency comparable to that of single-crystal silicon. In conventionally proposed methods as to such single-crystal silicon and polycrystalline silicon, a plate-shaped substrate was obtained by slicing a massive crystal. It was thus not easy to decrease the thickness of the substrate to below 0.3 mm. Therefore, the substrate had the thickness more than necessary for sufficient absorption of light quantity, and effective utilization of material was not enough. Namely, the substrate needed to be thinned more in order to further decrease the cost.

Proposed as a production method of polycrystalline silicon substrate with the aim of decreasing the cost was a method for forming a silicon sheet by a spin method of pouring a liquid droplet of molten Si into a mold. This method achieved the minimum thickness of about 0.1 to 0.2 mm, but the decrease of thickness was not sufficient as compared with the thickness of film (20 to 50 μm) necessary and sufficient for absorption of light as crystalline Si. In addition, this thinning method had the problem that it became difficult for the silicon sheet itself to maintain the strength as a substrate, so that another cheap substrate was inevitably necessitated for supporting the silicon sheet.

A report was made about attempts to make the solar cell by forming a substrate of metal-grade silicon and thereafter forming a silicon layer having a thickness necessary and sufficient for absorption of light thereon by the liquid-phase growth method (T. F. Ciszek, T. H. Wang, X. Wu, R. W. Burrows, J. Alleman, C. R. Schwerdtfeger and T. Bekkedahl, "Si thin layer growth from metal solution on single-crystal and cast metallurgical-grade multicrystalline Si substrates," 23rd IEEE Photovoltaic specialists Conference, (1993) p. 65).

In the above-stated method wherein the silicon layer was made on the low-purity silicon substrate of metal-grade silicon, using copper, aluminum, or tin as a metal solvent, however, the metal as a solvent was left mainly in grain boundaries in either case, because etchback for removing a native oxide film was carried out in the initial stage of growth. Therefore, characteristics of the solar cell were not sufficient. For the purpose of solving this problem, another method was reported which used a copper and aluminum alloy as the solvent without carrying out the etchback (T. H. Wang, T. F. Ciszek, C. R. Schwerdtfeger, H. Moutinho, R. Matson., "Growth of silicon thin layers on cast MG-Si from metal solutions for solar cells," Solar Energy Materials and Solar Cells 41/42 (1996), p. 19), but this method has problems including complex composition control of the alloy in regard to mass production.

A method for making the substrate of metal-grade silicon is also the same as the conventional polycrystalline process for forming an ingot by the cast method and slicing it to obtain the plate-shaped substrate. Such a method fails to make use of the merit of metal-grade silicon as a cheap material.

SUMMARY OF THE INVENTION

The present invention has been accomplished in view of the problems described above and an object of the present invention is to provide a fabrication process of a cheap crystalline solar cell with good characteristics.

Another object of the present invention is to provide a fabrication process of a thin-film crystalline silicon solar cell with good characteristics.

Another object of the present invention is to provide a cheap solar cell necessitating no slicing step, by melting and solidifying metal-grade silicon in a mold to form a plate-shaped metal-grade silicon and forming a crystal silicon layer thereon.

Still another object of the present invention is to provide a fabrication process of solar cell comprising a step of forming a silicon layer on a crystalline silicon substrate by a liquid-phase growth method with a metal solvent, wherein a total concentration of impurities of a surface of the crystalline silicon substrate is 10 ppm or more and wherein the metal solvent is indium.

A further object of the present invention is to provide a fabrication process of solar cell comprising a step of melting and solidifying particles of metal-grade silicon put in a mold to form a plate-shaped metal-grade silicon substrate, and a step of forming a silicon layer on a surface of the metal-grade silicon substrate by a liquid-phase growth method using indium.

A still further object of the present invention is to provide a fabrication process of solar cell comprising a step of melting and solidifying particles of metal-grade silicon put in a mold to form a plate-shaped metal-grade silicon substrate, a step of dissolving a surface of the metal-grade silicon substrate in a metal solvent and thereafter precipitating silicon in the metal solvent on the surface of the metal-grade silicon substrate to form a first silicon layer, and a step of forming a second silicon layer on a surface of the first silicon layer by a liquid-phase growth method using indium.

DETAILED DESCRIPTION OF THE PREFERRED EMBODIMENTS

The operation of the present invention will be described referring to FIGS. 1A to 1F and FIGS. 2A to 2H of schematic, cross-sectional views each to show the main steps in a fabrication process of the present invention.

In the figures, each of 101, 103, 201, and 203 designates a mold; each of 102 and 202 metal-grade silicon; each of 104 and 204 a silicon plate (hereinafter, also referred to as "silicon sheet"); each of 105, 205, and 210 a carbon boat; each of 106 and 211 indium; each of 106 and 206 a metal solvent; 207 reprecipitated silicon; each of 107 and 208 a silicon (active) layer; each of 108 and 209 an $n^+$ layer.

Figure 1A:
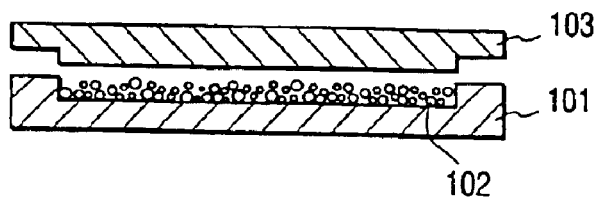
FIGS. 1A, 1B, 1C, 1D, 1E and 1F are schematic, cross-sectional views for explaining an example of steps of a fabrication process of solar cell according to the present invention.

(a-1) First, particulate metal-grade silicon are charged into a mold having a laterally plate-shaped groove (FIG. 1A). The silicon may be particles granules, powder or the like.

Figure 1B:
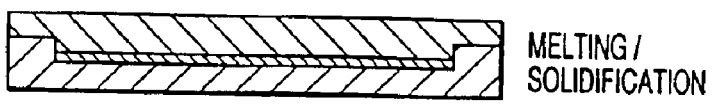
Figure 1C:

(a-2) This mold is put in an electric furnace and is kept at a temperature higher than the melting point of silicon (approx. 1415° C.) for a certain period of time, thereby melting the metal-grade silicon. Then the temperature is lowered to solidify the silicon to make a plate-shaped substrate (FIGS. 1B and 1C).

Figure 1D:
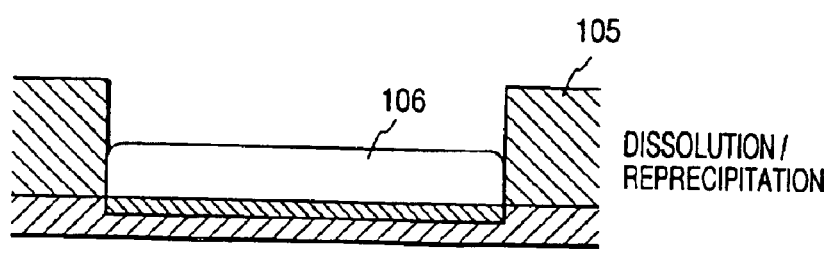
Figure 1E:
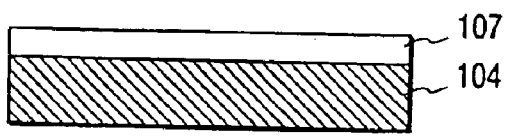

(a-3) The metal-grade silicon substrate thus obtained is placed in a boat made of carbon graphite or the like, and a silicon layer is deposited on this substrate by the liquid-phase growth method using indium in a hydrogen atmosphere (FIGS. 1D and 1E).

Figure 1F:
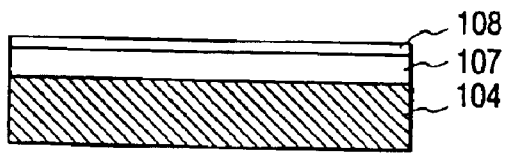

(a-4) A junction is formed on the surface of this silicon layer, thus fabricating a solar cell (FIG. 1F).

Another fabrication process of the present invention is carried out as follows.

Figure 2A:
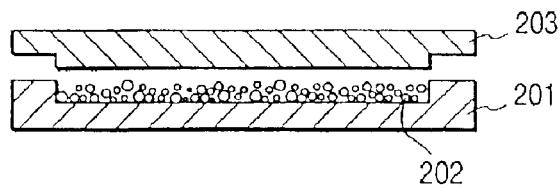
FIGS. 2A, 2B, 2C, 2D, 2E, 2F, 2G and 2H are schematic, cross-sectional views for explaining an example of steps of another fabrication process of solar cell according to the present invention.

(b-1) Particulate metal-grade silicon are charged into the mold having the laterally plate-shaped groove (FIG. 2A).

Figure 2B:
Figure 2C:

(b-2) This mold is put in the electric furnace and is kept at a temperature higher than the melting point of silicon (approx. 1415° C.) for a certain period of time, thereby melting the metal-grade silicon. Then the temperature is lowered to solidify the silicon to make a plate-shaped substrate (FIGS. 2B and 2C).

Figure 2D:
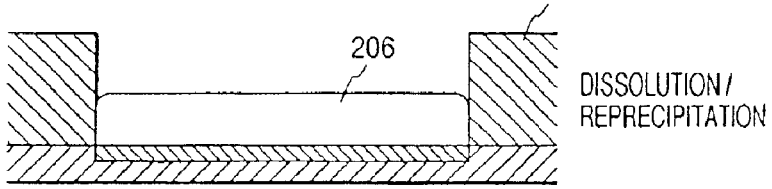
Figure 2E:
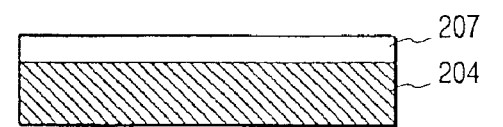

(b-3) The metal-grade silicon substrate thus obtained is placed in the boat made of carbon graphite or the like, and the boat is put in the electric furnace with a metal solvent, for example indium, being on and in contact with the metal-grade silicon substrate, thereby dissolving a surface layer of the metal-grade silicon substrate into the solvent. Then the temperature is lowered to make silicon saturated or supersaturated in the solvent and silicon is again precipitated on the surface of the metal-grade silicon substrate. The silicon precipitated at this time is of the p-type ($p^+$) (FIGS. 2D and 2E).

Figure 2F:
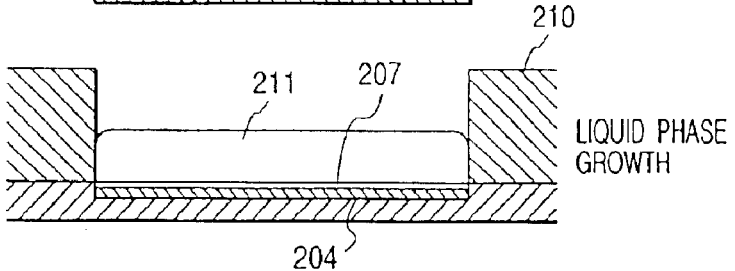
Figure 2G:

(b-4) The metal-grade silicon substrate thus obtained is placed in the boat made of carbon graphite or the like, and a silicon layer is further deposited on this substrate by the liquid-phase growth method using indium in a hydrogen atmosphere (FIGS. 2F and 2G).

Figure 2H:
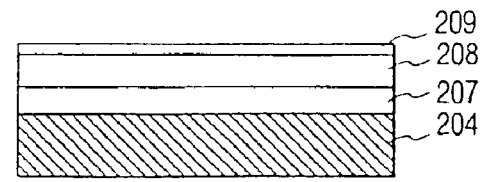

(b-5) A junction is formed on the surface of this silicon layer, thus fabricating a solar cell (FIG. 2H).

According to these methods, the silicon layer with less mixture of impurities, suitable for solar cell, can be formed by carrying out the liquid-phase growth with indium in contact with the surface of metal-grade silicon substrate. Since the plate-shaped metal-grade silicon substrate is directly formed by using the mold, the time-consuming, cumbersome step of slicing the substrate in the conventional cast method is excluded. Further, before the liquid-phase growth with indium, the surface layer of substrate is dissolved in the metal solvent and thereafter silicon is reprecipitated, whereby most impurities can be removed from the surface layer by the segregation effect. Owing to this, the silicon layer can be formed with high quality by the liquid-phase growth on the precipitated layer. At this time, boron B among the impurities contained in the substrate tends to remain in the reprecipitated layer. Thus, the reprecipitated layer becomes of the p-type ($p^+$). This p-type ($p^+$) layer can be utilized as a BSF (Back Surface Field) layer upon fabrication of solar cell.

Repetitively conducting many experiments, the inventor found out that thin-film crystalline solar cells with good characteristics were made by depositing a silicon layer on the surface of a low-purity silicon substrate like metal-grade silicon by the liquid-phase growth method using indium. The inventor also found out that thin-film crystalline solar cells with good characteristics were formed by depositing a silicon layer on the surface of a plate-shaped metal-grade silicon which was formed by melting and then solidifying in the mold, by the liquid-phase growth method using indium. In addition, the inventor further found that better solar cells were formed by depositing a silicon layer by the liquid-phase growth method using indium on a layer obtained after the surface layer of a plate-shaped metal-grade silicon melted and then solidified in the mold was dissolved and reprecipitated in the metal solvent. The fabrication processes of solar cell according to the present invention will be described in detail.

The liquid-phase growth method used in the present invention is carried out under a hydrogen atmosphere for the purpose of removing a native oxide film present in the surface of silicon substrate. The temperature of growth is selected preferably in the range of 500 to 1100° C. and more preferably in the range of 700 to 1050° C.

Indium used in the present invention is one having a high purity in the range of 99.9% to 99.9999%.

The liquid-phase growth method applied in the present invention is normally the annealing method or the temperature difference method, but the isothermal method by the inventor (Japanese Patent Application Laid-Open No. 6-191987) can also be employed.

The metal-grade silicon used for the substrate for solar cell of the present invention is one of low purity, specifically, one containing 0.1% to 2% of impurity elements, which is cheap and easy to use. It is also possible to reduce an amount of impurities by forming the metal-grade silicon into particles, granules or powder and preliminarily carrying out treatment with an acid such as hydrochloric acid with necessity before melting it.

The mold used in the present invention is a one having a lateral or longitudinal plate-shaped groove or a plurality of such grooves may be provided in one mold. The material for the mold is carbon graphite in regard to easiness of processing and price, but the material may also be selected from any materials to which a material for releasing silicon melted and then solidified can be applied and which have melting points higher than that of silicon. Silicon carbide, silicon nitride, or boron nitride can also be used. When flow of heat is controlled upon solidification by asymmetrically shaping the mold in the vertical direction for the lateral groove or in the horizontal direction for the longitudinal groove, or by providing the mold with heat-radiating plates, it is also possible to segregate the impurities in the metal-grade silicon on one surface side of sheet of the metal-grade silicon and to increase the crystal grain size.

The mold releasing agent applied to the inside of the mold, used in the present invention, is selected from those having large contact angles and not reacting with molten silicon. A specific example is a one containing $Si_3N_4$ as a main ingredient, and if necessary, $SiO_2$ or the like is added. The way to form the coating of the mold releasing agent within the mold is a method for spraying an organic solution or a silanol solution containing powder of $Si_3N_4$ dispersed therein into the mold and thermally treating it at the temperature of 400° C. or more, thereby forming the coating.

The metal solvent for dissolving and reprecipitating the surface of metal-grade silicon substrate, employed in the present invention, is selected from those having relatively low melting points and sufficiently dissolving the surface layer of silicon substrate. As examples of such metal solvents, indium, gallium, tin and the like are preferred.

Carbon graphite is mainly used for the boat upon the liquid-phase growth using indium and for the boat upon dissolution and reprecipitation of the surface of metal-grade silicon sheet by the metal solvent, used in the present invention. In addition, silicon carbide, silicon nitride, or the like can also be applied. The method for bringing the metal solvent into contact with the surface of silicon sheet is mainly the slide method or the dipping method.

The furnace used in the present invention is preferably an electric furnace in respect of controllability. The furnace should be a one capable of stably keeping the temperature up to above the melting point of silicon, and is preferably a one capable of decreasing the temperature at the rate of approximately −30° C./min or less in respect of maintaining crystallinity of the sheet formed by solidification. The furnace used in dissolution/reprecipitation of the surface of sheet substrate by the metal solvent is also pursuant to the electric furnace stated above.

The experiments conducted by the inventor for achieving the fabrication processes of solar cell stated above will be described in detail.

Experiment 1

This experiment was conducted to investigate the relation between impurity concentrations of the surface of a single-crystal substrate and characteristics of a solar cell made using a silicon layer grown in liquid phase on the single-crystal substrate, as an active layer (power generating layer).

$P^+$ (100) single-crystal silicon substrates having specific resistance of 0.01 Ω·cm were intentionally polluted with impurities of Cu, Fe, Ti, and so on, so as to prepare substrates having four levels of impurity concentration. On each substrate, a silicon layer was grown in liquid phase with a solvent of indium or tin in a hydrogen atmosphere. After the liquid-phase growth, the solar cells were fabricated and characteristics thereof were measured. At the same time, the characteristics of the thus fabricated solar sells were compared with standard characteristics of a solar cell fabricated after the silicon layer was grown on a substrate which was not polluted with impurity, in the same manner using the solvent of indium or tin.

TABLE 1

| | | Total concentration of impurities | | | |
|---|---|---|---|---|---|
| | | 1 ppm | 10 ppm | 100 ppm | 1000 ppm |
| Characteristics of solar cell | Indium solvent | AA | AA | AA | A |
| | Tin solvent | A | B | C | C |

(AA: equivalent to standard, A: slightly inferior, B: inferior, C: considerably inferior)

The results, as shown in Table 1, showed that with use of the solvent of tin the characteristics (conversion efficiency) were extremely degraded when the total concentration of impurities was 10 ppm or more, whereas with use of the solvent of indium the characteristics exhibited no great change even when the substrate was polluted in about 1000 ppm.

This clarified that when a silicon layer was grown on a single-crystal silicon substrate by the liquid-phase growth method using the solvent of indium, the silicon layer exhibiting good characteristics of solar cell was formed even when the impurity concentration of substrate was high.

Experiment 2

This experiment was conducted to investigate the relation between impurity concentrations of the surface of a polycrystalline substrate and characteristics of a solar cell made using a silicon layer grown in liquid phase on the polycrystalline substrate, as an active layer (power generating layer).

$P^+$ (100) polycrystalline silicon substrates having specific resistance of 0.01 Ω·cm, obtained by slicing a cast ingot, were intentionally polluted with impurities of Cu, Fe, Ti, and so on, so as to prepare substrates having four levels of impurity concentration. On each substrate, the silicon layer was grown in liquid phase with the solvent of indium or tin in the hydrogen atmosphere. After the liquid-phase growth, the solar cells were fabricated and characteristics thereof were measured. At the same time, the characteristics of the thus fabricated solar cells were compared with standard characteristics of a solar cell fabricated after the silicon layer was grown on a substrate which was not polluted with impurity, in the same manner with the solvent of indium or tin.

TABLE 2

| | | Total concentration of impurities | | | |
|---|---|---|---|---|---|
| | | 1 ppm | 10 ppm | 100 ppm | 1000 ppm |
| Characteristics of solar cell | Indium solvent | AA | AA | AA | A |
| | Tin solvent | A | C | C | C |

(AA: equivalent to standard, A: slightly inferior, B: inferior, C: considerably inferior)

The results, as shown in Table 2, showed that with use of the solvent of tin the characteristics (conversion efficiency) were extremely degraded when the total concentration of impurities was 10 ppm or more, whereas with use of the solvent of indium the characteristics exhibited no great change even when the substrate was polluted in about 1000 ppm.

This clarified that when a silicon layer was grown on a polycrystalline silicon substrate by the liquid-phase growth method using the solvent of indium, the silicon layer exhibiting good characteristics of solar cell was formed even when the impurity concentration of substrate was high.

From the results of Experiments 1 and 2, it was found that a silicon layer with good quality was obtained even when the silicon layer was formed on a crystalline silicon substrate having the impurity concentration of 10 ppm or more by the liquid-phase growth method using the solvent of indium.

Reasons of this are possibly (1) that since indium is likely to form an alloy with metal elements, impurities soaking out of the substrate thus remain in the indium solvent and (2) that indium is hard to go into the silicon layer during deposition (for example, the indium concentration is $5\times10^{14}/cm^3$ or less in the silicon layer grown in liquid phase at 950° C.).

Experiment 3

The present experiment was conducted to investigate the method for forming the sheet-shaped (herein after, also referred to as "plate-shaped") metal-grade silicon by melting and solidifying particulate metal-grade silicon.

As shown in FIG. 1A, the mold 101 was made of carbon with a laterally plate-shaped groove and a coating of $Si_3N_4$ film was formed on the surface of the groove for the purpose of readily taking solidified silicon out. Particulate metal-grade silicon 102 were charged into the groove in the mold and the mold capped with lid (mold) 103 was placed in the electric furnace. Then the mold was kept at a fixed temperature higher than the melting point of silicon for a certain period of time to melt the particulate metal-grade silicon. Then the temperature of the electric furnace was decreased gradually to solidify the metal-grade silicon. Plate-shaped sheet 104 solidified was taken out of the mold and elemental analysis was conducted of a region near the surface of the sheet. Table 3 shows results of impurity analysis of the metal-grade silicon of the raw material (particulate metal-grade silicon) and the sheet obtained.

TABLE 3

| Impurities | Particulate metal-grade Si | Sheet-shaped metal-grade Si |
| --- | --- | --- |
| B | 50 ppm | 60 ppm |
| Al | 4500 ppm | 350 ppm |
| Ni | 510 ppm | 20 ppm |
| Fe | 8200 ppm | 4 ppm |
| Cr | 370 ppm | 2 ppm |
| Mn | 130 ppm | 1 ppm |
| Ti | 250 ppm | 4 ppm |

The impurities decreased greatly on the whole and the total concentration was reduced to about 1/30.

Grain boundaries were visualized by Secco etching, which indicated that the crystal grain size of the obtained sheet was increased to several mm to several cm and was equivalent to that in the case of the silicon ingot obtained by the conventional casting method.

Experiment 4

The present experiment was conducted to investigate the method for forming the p$^+$-silicon layer with less impurities on the sheet-shaped metal-grade silicon substrate, i.e., silicon sheet. The sheet obtained in Experiment 3 was placed in the carbon boat 205 as shown in FIG. 2D, the metal solvent 206 of indium was brought into contact with the sheet thereon, and the boat was placed in the electric furnace to be kept at 1000° C., thereby dissolving the surface layer of metal-grade silicon sheet into the indium solvent. This state was kept for a while and after sufficient saturation the temperature was decreased with controlling the electric furnace, thereby again precipitating silicon in the solvent onto the surface of the silicon sheet. After precipitation for a fixed period of time, the indium solvent in contact with the sheet was removed to obtain the desired silicon precipitate layer 207.

Table 4 shows results of analysis of elements contained in the surface of the obtained sheet, i.e., in the silicon layer precipitated on the surface of silicon sheet.

TABLE 4

| Impurities | Precipitate Si layer |
| --- | --- |
| B | 10 ppm |
| Al | 3 ppm |
| Ni | <5 ppm |
| Fe | 2.5 ppm |
| Cr | 0.6 ppm |
| Mn | <0.2 ppm |
| Ti | <1 ppm |

From Table 4, it was confirmed that the total concentration of impurities in the precipitated silicon layer was further decreased to 1/20 or less of that of the sheet-shaped metal-grade silicon.

Determination of pn was made by the thermoelectromotive force method, which showed that the precipitated silicon layer 207 was of the p-type (p$^+$).

Experiment 5

In the present experiment, a silicon layer was formed on the metal-grade silicon sheets obtained in Experiments 3 and 4 by the liquid-phase growth method using the indium solvent, and surface morphology thereof was investigated.

The sheet substrate 104 made in Experiment 3 was placed in the boat of carbon graphite as shown in FIG. 1D and the silicon layer 107 with a thickness of 30 μm was formed at the temperature-decreasing rate of −1° C./min with the growth start temperature of 950° C. and the supercooling temperature of 4° C. in the hydrogen atmosphere. The silicon sheet having the formed silicon layer 107 will be referred to as sheet 1. In the same manner, the sheet substrate having the precipitated silicon layer (p$^+$) 207 made in Experiment 4 was placed in the boat of carbon graphite as shown in FIG. 2F, and the silicon layer 208 with a thickness of 30 μm was formed on the p$^+$ layer 207 of the sheet substrate at the temperature-decreasing rate of −1° C./min with the growth start temperature of 950° C. and the supercooling temperature of 4° C. in the hydrogen atmosphere. The silicon sheet having the formed silicon layer 208 will be referred to as sheet 2.

After formation of the silicon layers 107 and 208, the surfaces of silicon layers 107 and 208 were observed with an optical microscope and a scanning electron microscope. Results of the observation showed that in either case the relatively flat silicon layer 107 and 208 were obtained and each of them was equivalent to the surface of the silicon sheet 104 or the p$^+$ layer 207. In addition, crystal grain sizes of the silicon layer 107 and 208 were also close to those of the silicon sheets 104 and 204 as being a ground layer. Further, etch pit densities in the surfaces of the silicon layers 107 and 208 thus grown were approximately $1\times10^5$ pits/cm$^2$ and approximately $2\times10^4$ pits/cm$^2$, respectively.

Experiment 6

In the present experiment, thin-film solar cells were made using as an active layer the silicon layer 107 on the sheet 1 and the silicon layer on the sheet 2 formed in Experiment 5.

P was implanted into the surfaces of silicon layers 107 and 208 under the conditions of 80 keV and $1\times10^{15}$/cm$^2$ by the ion implantation method and the silicon layers were annealed at 950° C. for 30 minutes, thereby forming the n$^+$ layers 108 and 209, respectively.

After that, transparent electrodes (ITO (0.085 μm)) were formed on the n$^+$ layers 108 and 209, respectively, and collector electrodes (Cr (0.02 μm)/Ag (1 μm)/Cr (0.004 μm))

were formed on each transparent electrode, successively by vacuum vapor deposition.

Al was evaporated on the back surface of sheet 1 and sheet 2 as being a substrate, thereby forming the back electrode.

For the thin-film crystalline solar cells thus fabricated, I–V characteristics were measured under AM 1.5 (100 mW/cm$^2$) illumination. As the result of measurement, the solar cell using the sheet 1 and having the cell area of 2 cm$^2$ demonstrated the open-circuit voltage of 0.56 V, the short-circuit photocurrent of 27 mA/cm$^2$, the curve factor of 0.75, and the conversion efficiency of 11.3%. The solar cell using the sheet 2 and having the cell area of 2 cm$^2$ demonstrated the open-circuit voltage of 0.57 V, the short-circuit photocurrent of 28 mA/cm$^2$, the curve factor of 0.78, and the conversion efficiency of 12.4%.

From the results of the experiments as discussed above, it is clear that a silicon layer can be obtained with good quality when the silicon layer is made on the crystalline silicon substrate having the impurity concentration of 10 ppm or more by the liquid-phase growth method using the solvent of indium, and that the thin-film crystalline solar cells can be made with good characteristics by melting and solidifying the particulate metal-grade silicon to form the silicon sheet, dissolving and reprecipitating the surface thereof with the metal solvent to form the p-type (p$^+$) silicon layer 207, and thereafter forming a silicon layer thereon by the liquid-phase growth method using the solvent of indium.

The thickness of the silicon layer made in the present invention is preferably 10 μm or more, more preferably from 10 μm to 100 μm, and further more preferably from 10 μm to 50 μm, from the viewpoint of efficient absorption of light.

EXAMPLES

The fabrication processes of solar cell according to the present invention will be described in more detail with examples, but it is noted that the present invention is intended to be limited to these examples.

EXAMPLE 1

In the present example, a silicon layer was deposited on a low-purity silicon wafer obtained by slicing an ingot using the liquid-phase growth method using indium, and a thin-film solar cell was made using it as an active layer.

An ingot was pulled up from the raw material of metal-grade silicon of purity 98% by the CZ (Czochralski) method and it was sliced in a wafer of 0.5 mm thick to obtain a metal-grade silicon substrate. The elemental analysis was conducted for the region near the surface of the metal-grade silicon substrate thus made, thereby obtaining the results of Table 5.

TABLE 5

| Impurities | Metal-grade Si substrate |
| --- | --- |
| B | 8 ppm |
| Al | 2 ppm |
| Ni | <5 ppm |
| Fe | 1 ppm |
| Cr | 0.6 ppm |
| Mn | <0.2 ppm |
| Ti | <1 ppm |

The crystal grain size of the metal-grade silicon substrate was several mm to several cm and the specific resistance thereof was 0.05 Ω·cm (p-type). The metal-grade silicon substrate thus made was placed in the carbon boat, and a silicon layer 50 μm thick was formed at the temperature-decreasing rate of −2° C./min with the growth start temperature 950° C. and the supercooling temperature 7° C. in the hydrogen atmosphere by the liquid-phase growth method using the solvent of indium.

Then thermal diffusion of P was effected at the temperature of 900° C. from a diffusion source of POCl$_3$ into the surface of the silicon layer to form an n$^+$ layer, thereby obtaining a junction depth of about 0.5 μm. A dead layer in the surface of the n$^+$ layer thus formed was removed by etching, thereby obtaining the junction depth of about 0.2 μm having a moderate surface concentration. Further, the transparent conductive film, ITO about 0.1 μm thick was formed on the n$^+$ layer by electron beam vapor deposition, and the collector electrode (Cr (0.02 μm)/Ag (1 μm)/Cr (0.004 μm)) was further formed thereon by vacuum vapor deposition. The back electrode was made by evaporating Al on the back surface of the sheet as being the substrate.

For the thin-film crystalline solar cell thus fabricated, the I–V characteristics were measured under AM 1.5 (100 mW/cm$^2$) illumination and the solar cell with the cell area of 2 cm$^2$ demonstrated the open-circuit voltage of 0.57 V, the short-circuit photocurrent of 31 mA/cm$^2$, the curve factor of 0.77, and the conversion of efficiency of 13.6%.

EXAMPLE 2

In the present example, the particulate metal-grade silicon was melted and solidified to make a sheet of metal-grade silicon, a silicon layer was deposited thereon by the liquid-phase growth method using indium, and the thin-film solar cell was made using the silicon layer as an active layer. The fabrication process will be described according to the procedures of the fabrication steps shown in FIGS. 1A to 1F.

(1) Particulate metal-grade silicon (purity 98%) was soaked in a mixture solution of hydrochloric acid and hydrogen peroxide heated at 120° C. to leach out impurities, followed by washing with water and drying. Then the silicon was charged into the groove in the mold of carbon graphite as shown in FIG. 1A. At this time the coating for release of mold was formed on the internal surface of the groove of mold by preliminarily applying a silanol solution containing Si$_3$N$_4$ powder dispersed therein to the inside of mold and thermally treating it at 400° C.

(2) The mold was put in the electric furnace to be kept at a constant temperature (1500° C.) higher than the melting point of silicon. After a lapse of appropriate time (30 minutes to 1 hour), it was annealed at the temperature-decreasing rate of −10° C./min to effect solidification, thereby obtaining a sheet of metal-grade silicon (silicon sheet) 104.

Table 6 shows results of elemental analysis for the region near the surface of the silicon sheet 104 thus made. From Table 6, it was assured that the impurities in the silicon sheet were decreased greatly as compared with the metal-grade silicon of raw material. The crystal grain size of the silicon sheet was several mm to several cm and the specific resistance thereof was 0.01 Ω·cm (p-type).

TABLE 6

| Impurities | Si sheet |
| --- | --- |
| B | 12 ppm |
| Al | 30 ppm |
| Ni | <5 ppm |

TABLE 6-continued

| Impurities | Si sheet |
|---|---|
| Fe | 1 ppm |
| Cr | 0.8 ppm |
| Mn | <0.2 ppm |
| Ti | <1 ppm |

(3) The silicon sheet thus made was placed in the carbon boat as shown in FIG. 1D, and a silicon layer 50 μm thick was formed at the temperature-decreasing rate of −1.5° C./min with the growth start temperature 950° C. and the supercooling temperature 5° C. in the hydrogen atmosphere by the liquid-phase growth method using the solvent of indium.

(4) Thermal diffusion of P was effected at the temperature of 900° C. from the diffusion source of $POCl_3$ into the surface of the silicon layer to form the $n^+$ layer, thereby obtaining the junction depth of about 0.5 μm. Then the dead layer in the surface of the $n^+$ layer thus formed was removed by etching, thereby obtaining the junction depth of about 0.2 μm having a moderate surface concentration.

(5) Further, an ITO film approximately 0.1 μm thick was made as a transparent electrode on the $n^+$ layer by electron beam vapor deposition.

(6) The collector electrode (Cr (0.02 μm)/Ag (1 μm)/Cr (0.004 μm)) was made on the transparent electrode by vacuum vapor deposition.

(7) Al was evaporated on the back surface of the silicon sheet as being the substrate, thus forming the back electrode.

For the thin-film crystalline solar cell thus fabricated, the I–V characteristics were measured under AM 1.5 (100 mW/cm$^2$) illumination. As the result of measurement, the solar cell with the cell area of 2 cm$^2$ demonstrated the open-circuit voltage of 0.56 V, the short-circuit photocurrent of 30 mA/cm$^2$, the curve factor of 0.78, and the conversion efficiency of 13.1%.

EXAMPLE 3

In the present example, a $p^+$ silicon layer was formed by bring the silicon sheet into contact with the metal solvent 206 of tin, a silicon layer was deposited thereon by the liquid-phase growth method using indium, and the thin-film solar cell was made using the silicon layer as an active layer. The fabrication process will be described according to the procedures of the fabrication steps shown in FIGS. 2A to 2H.

(1) Partculate metal-grade silicon was soaked in the mixture solution of hydrochloric acid and hydrogen peroxide heated at 120° C. to leach out impurities, followed by washing with water and drying Then the silicon was charged into the groove in the mold of carbon graphite as shown in FIG. 2A. At this time the coating for release of mold was formed on the internal surface of the groove of mold by preliminarily applying the silanol solution containing $Si_3N_4$ powder dispersed therein to the inside of mold and thermally treating it at 400° C.

(2) The mold was put in the electric furnace to be kept at a constant temperature (1460° C.) higher than the melting point of silicon. After a lapse of appropriate time (30 minutes to 1 hour), it was annealed at the temperature-decreasing rate of −6° C./min to effect solidification, thereby obtaining a sheet of metal-grade silicon (silicon sheet) 204.

(3) After the silicon sheet solidified was taken out, the silicon sheet thus fabricated was placed in the carbon boat as shown in FIG. 2D. Then the boat was put in the electric furnace with the metal solvent of tin being brought into contact with the silicon sheet thereon. The inside of the electric furnace was kept at 1050° C. to dissolve the surface layer of the silicon sheet in the tin solvent. This state was maintained for several hours to effect sufficient saturation, and then the temperature was decreased at the rate of −3° C./min with controlling the electric furnace, thereby again precipitating silicon in the solvent onto the surface of the silicon sheet. After the precipitation of one hour, the boat was slid to take the tin solvent away, thus obtaining a desired silicon precipitate layer 207.

Table 7 shows results of analysis of elements contained in the surface of the obtained sheet, i.e., in the silicon layer 207 precipitated on the surface of the silicon sheet.

TABLE 7

| Impurities | Precipitate Si layer |
|---|---|
| B | 6 ppm |
| Al | 0.4 ppm |
| Ni | <5 ppm |
| Fe | 1.4 ppm |
| Cr | 0.03 ppm |
| Mn | <0.2 ppm |
| Ti | <1 ppm |

From Table 7, it is apparent that the amount of impurities is decreased greatly in the silicon precipitate layer 207 as compared with the particulate metal-grade silicon of raw material. The thickness of the reprecipitated silicon layer obtained was about 60 μm from observation of cross section by SEM/EDX.

Determination of pn by the thermoelectromotive force method showed that the precipitate silicon layer was of the p-type ($p^+$).

(4) The silicon sheet thus made was placed in the carbon boat as shown in FIG. 2F, and a silicon layer 40 μm thick was further formed at the temperature-decreasing rate of −25° C./min with the growth start temperature 930° C. and the supercooling temperature 7° C. in the hydrogen atmosphere by the liquid-phase growth method using the solvent of indium.

(5) Thermal diffusion of P was effected at the temperature of 900° C. from the diffusion source of $POCl_3$ into the surface of the silicon layer to form a $n^+$ layer, thereby obtaining the junction depth of about 0.5 μm. Then the dead layer in the surface of the $n^+$ layer thus formed was removed by etching, thereby obtaining the junction depth of about 0.15 μm having a moderate surface concentration.

(6) Further, an ITO film approximately 0.1 μm thick was made as a transparent electrode on the $n^+$ layer by electron beam vapor deposition.

(7) The collector electrode (Cr (0.02 μm)/Ag (1 μm)/Cr (0.004 μm)) was made on the transparent electrode by vacuum vapor deposition.

(8) Al was evaporated on the back surface of the silicon sheet as being the substrate, thus forming the back electrode.

For the thin-film crystalline solar cell thus fabricated, the I–V characteristics were measured under AM 1.5 (100 mW/cm$^2$) illumination. As the result of measurement, the solar cell with the cell area of 2 cm$^2$ demonstrated the open-circuit voltage of 0.58 V, the short-circuit photocurrent of 31 mA/cm$^2$, the curve factor of 0.76, and the conversion efficiency of 13.7%.

EXAMPLE 4

The present example is different from Example 3 in that the solar cell was made using the metal solvent of gallium and the mold of SiC.

The fabrication process will be described according to the procedures of the fabrication steps of FIGS. 2A to 2H.

(1) The mold of SiC as shown in FIG. 2A was made, and thereafter the silanol solution containing $Si_3N_4$ powder dispersed therein was applied onto the internal surface of the groove in the mold and was then thermally treated at 600° C., thereby forming the coating for release of mold.

(2) Particulate metal-grade silicon was soaked in the mixture solution of hydrochloric acid and hydrogen peroxide heated at 120° C. to leach out impurities, followed by washing with water and drying. Then the silicon was charged into the groove in the mold.

(3) The mold was put in the electric furnace to be kept at a constant temperature of 1480° C. After a lapse of about 40 minutes, it was annealed at the temperature-decreasing rate of −7.5° C./min to effect solidification, thereby obtaining a sheet of metal-grade silicon (silicon sheet) 204.

(4) After the silicon sheet solidified was taken out, the silicon sheet thus fabricated was placed in the carbon boat as shown in FIG. 2D. Then the boat was put in the electric furnace with the metal solvent of gallium being brought into contact with the silicon sheet thereon. The inside of the electric furnace was kept at 650° C. to dissolve the surface layer of the silicon sheet in the gallium solvent. This state was maintained for several hours to effect sufficient saturation, and then the temperature was decreased at the rate of −4° C./min with controlling the electric furnace, thereby again precipitating silicon in the solvent onto the surface of the silicon sheet. After the precipitation of 30 minutes, the boat was slid to take the gallium solvent away, thus obtaining a desired silicon precipitate layer 207.

Table 8 shows results of analysis of elements contained in the surface of the obtained sheet, i.e., in the silicon layer 207 precipitated on the surface of the silicon sheet.

TABLE 8

| Impurities | Precipitate Si layer |
| --- | --- |
| B | 8 ppm |
| Al | <0.1 ppm |
| Ni | 5 ppm |
| Fe | 0.2 ppm |
| Cr | <0.01 ppm |
| Mn | <0.2 ppm |
| Ti | 1 ppm |

From Table 8, it is apparent that the amount of impurities is decreased greatly in the silicon precipitate layer 207 as compared with the particulate metal-grade silicon of raw material. The thickness of the reprecipitated silicon layer obtained was about 40 μm from observation of cross section by SEM/EDX.

Determination of pn by the thermoelectromotive force method showed that the preciptate silicon layer was of the p-type ($p^+$).

(5) The silicon sheet thus made was placed in the carbon boat as shown in FIG. 2F, and a silicon layer 40 μm thick was further formed at the temperature-decreasing rate of −1.0° C./min with the growth start temperature 940° C. and the supercooling temperature 6° C. in the hydrogen atmosphere by the liquid-phase growth method using the solvent of indium.

(6) Thermal diffusion of P was effected at the temperature of 900° C. from the diffusion source of $POCl_3$ into the surface of the silicon layer to form an $n^+$ layer, thereby obtaining the junction depth of about 0.5 μm. Then the dead layer in the surface of the $n^+$ layer thus formed was removed by etching, thereby obtaining the junction depth of about 0.2 μm having a moderate surface concentration.

(7) Further, an ITO film approximately 0.1 μm thick was made as a transparent electrode on the $n^+$ layer by electron beam vapor deposition.

(8) The collector electrode (Cr (0.02 μm)/Ag (1 μm)/Cr (0.004 μm)) was made on the transparent electrode by vacuum vapor deposition.

(9) Al was evaporated on the back surface of the silicon sheet as being the substrate, thus forming the back electrode.

For the thin-film crystalline solar cell thus fabricated, the I–V characteristics were measured under AM 1.5 (100 mW/cm$^2$) illumination. As the result of measurement, the solar cell with the cell area of 2 cm$^2$ demonstrated the open-circuit voltage of 0.56 V, the short-circuit photocurrent of 30 mA/cm$^2$, the curve factor of 0.76, and the conversion efficiency of 12.8%.

EXAMPLE 5

The present example is different from Example 3 in that the solar cell was made using the metal solvent of indium and the mold of $Si_3N_4$.

The fabrication process will be described according to the procedures of the fabrication steps of FIGS. 2A to 2H.

(1) The mold of $Si_3N_4$ as shown in FIG. 2A was made. Particulate metal-grade silicon was soaked in the mixture solution of hydrochloric acid and hydrogen peroxide heated at 120° C. to leach out impurities, followed by washing with water and drying. Then the silicon was charged into the groove in the mold. The mold was put in the electric furnace to be kept at a constant temperature of 1460° C. After a lapse of one hour, it was annealed at the temperature-decreasing rate of −5° C./min to effect solidification, thereby obtaining a sheet of metal-grade silicon (silicon sheet) 204.

(2) After the plate-shaped silicon sheet solidified was taken out, the silicon sheet thus obtained was placed in the carbon boat as shown in FIG. 2D. Then the boat was put in the electric furnace with the metal solvent of indium being brought into contact with the silicon sheet thereon. The inside of the electric furnace was kept at 800° C. to dissolve the surface layer of the silicon sheet in the indium solvent. This state was maintained for several hours to effect sufficient saturation, and then the temperature was decreased at the rate of −3° C./min with controlling the electric furnace, thereby again precipitating silicon in the solvent onto the surface of the silicon sheet. After the precipitation of two hours, the boat was slid to take the indium solvent away, thus obtaining a desired silicon precipitate layer 207.

Table 9 shows results of analysis of elements contained in the surface of the obtained sheet, i.e., in the silicon layer 207 precipitated on the surface of the silicon sheet.

TABLE 9

| Impurities | Precipitate Si layer |
| --- | --- |
| B | 5 ppm |
| Al | <0.1 ppm |
| Ni | <5 ppm |
| Fe | 0.1 ppm |
| Cr | <0.01 ppm |
| Mn | <0.2 ppm |
| Ti | <1 ppm |

From Table 9, it is apparent that the amount of impurities is decreased greatly in the silicon precipitate layer 207 as compared with the particulate metal-grade silicon of raw material. The thickness of the reprecipitated silicon layer obtained was about 40 μm from observation of cross section by SEM/EDX.

Determination of pn by the thermoelectromotive force method showed that the precipitate silicon layer was of the p-type ($p^+$).

(3) Liquid-phase growth took place on the surface of this silicon sheet, i.e., on the silicon layer 207 precipitated, using another indium solvent different from that used in the previous steps of dissolution and reprecipitation. That is, a silicon layer 50 μm thick was further formed at the temperature-decreasing rate of −1° C./min with the growth start temperature 950° C. and the supercooling temperature 4° C. in the hydrogen atmosphere.

(4) Thermal diffusion of P was effected at the temperature of 900° C. from the diffusion source of $POCl_3$ into the surface of the silicon layer to form an $n^+$ layer, thereby obtaining the junction depth of about 0.5 μm. Then the dead layer of the surface of the $n^+$ layer thus formed was removed by etching, thereby obtaining the junction depth of about 0.2 μm having a moderate surface concentration.

(5) Further, an ITO film approximately 0.1 μm thick was made as a transparent electrode on the $n^+$ layer, made in step (4), by electron beam vapor deposition.

(6) The collector electrode (Cr (0.02 μm)/Ag (1 μm)/Cr (0.004 μm)) was made on the transparent electrode by vacuum vapor deposition.

(7) Al was evaporated on the back surface of the silicon sheet as being the substrate, thus forming the back electrode.

For the thin-film crystalline solar cell thus fabricated, the I–V characteristics were measured under AM 1.5 (100 mW/cm$^2$) illumination. As the result of measurement, the solar cell with the cell area of 2 cm$^2$ demonstrated the open-circuit voltage of 0.58 V, the short-circuit photocurrent of 31 mA/cm$^2$, the curve factor of 0.78 and the conversion efficiency of 14.0%.

Effects of the Invention

As described above, the present invention permits the thin-film crystalline silicon solar cells with good characteristics to be fabricated by the simple steps without slicing of an ingot. Therefore, it can make the mass-producible, cheap, good-quality, thin-film solar cells commercially available.

What is claimed is:

1. A solar cell fabrication process comprising a step of dissolving a surface of a plate-shaped metal-grade silicon substrate with a metal solvent and thereafter precipitating silicon in said metal solvent on the surface of said metal-grade silicon substrate to form a first silicon layer, and a step of further forming a second silicon layer on a surface of said first silicon layer by a liquid-phase growth method using indium.

2. A solar cell fabrication process according to claim 1, wherein said first silicon layer is p-type silicon containing 10 ppm to 100 ppm of impurities.

3. A solar cell fabrication process according to claim 1, wherein said metal solvent is selected from the group consisting of indium, gallium, and tin.

4. A solar cell fabrication process according to claim 1, wherein a thickness of said second silicon layer is 10 μm or more.

5. A solar cell fabrication process according to claim 1, further comprising a step of melting and solidifying particles of metal-grade silicon put in a mold to form said metal-grade silicon substrate.

6. A solar cell fabrication process according to claim 5, wherein a material for said mold is selected from the group consisting of carbon graphite, silicon carbide, and silicon nitride.

7. A solar cell fabrication process according to claim 6 or 5, wherein a surface of said mold to be in contact with said metal-grade silicon substrate is coated with a mold releasing agent containing at least silicon nitride.

\* \* \* \* \*

UNITED STATES PATENT AND TRADEMARK OFFICE
CERTIFICATE OF CORRECTION

PATENT NO. : 6,869,863 B2
DATED : March 22, 2005
INVENTOR(S) : Shoji Nishida

It is certified that error appears in the above-identified patent and that said Letters Patent is hereby corrected as shown below:

Column 11,
Line 52, "drying" should read -- drying. --.

Column 13,
Table 8, "5 ppm" should read -- <5 ppm --.

Column 16,
Line 33, "claim 6 or" should read -- claims 5 or 6 --; and
Line 34, "5," should be deleted.

Signed and Sealed this

Seventh Day of February, 2006

JON W. DUDAS
*Director of the United States Patent and Trademark Office*